US010048599B2

(12) United States Patent
Peijster

(10) Patent No.: US 10,048,599 B2
(45) Date of Patent: Aug. 14, 2018

(54) ADJUSTMENT ASSEMBLY AND SUBSTRATE EXPOSURE SYSTEM COMPRISING SUCH AN ADJUSTMENT ASSEMBLY

(71) Applicant: Mapper Lithography IP B.V., Delft (NL)

(72) Inventor: Jerry Johannes Martinus Peijster, Houten (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 15/396,032

(22) Filed: Dec. 30, 2016

(65) Prior Publication Data
US 2018/0188659 A1   Jul. 5, 2018

(51) Int. Cl.
*G03B 27/58*  (2006.01)
*G03F 7/20*   (2006.01)

(52) U.S. Cl.
CPC ...... *G03F 7/70716* (2013.01); *G03F 7/70758* (2013.01)

(58) Field of Classification Search
CPC ............. G03F 7/70716; G03F 7/70758; G03F 7/70816; F16C 29/025; F16C 32/0614; G12B 5/00
(Continued)

(56) References Cited
U.S. PATENT DOCUMENTS
2004/0008331 A1   1/2004  Cox et al.
2008/0013058 A1   1/2008  Tatsuzaki
(Continued)

FOREIGN PATENT DOCUMENTS
EP            1143492 A1   10/2001
WO   WO-2012039606 A1    3/2012
WO   WO-2013034753 A1    3/2013

OTHER PUBLICATIONS
Mapper Lithography IP, et al., "Search Report and Written Opinion," NL Application No. 2018108 (Sep. 19, 2017) (with English translation of Written Opinion).
(Continued)

*Primary Examiner* — Peter B Kim
(74) *Attorney, Agent, or Firm* — Womble Bond Dickinson (US) LLP

(57) ABSTRACT

The invention relates to a substrate exposure system comprising a frame, a substrate support module for carrying a substrate, an exposure apparatus for exposing said substrate, and adjustment assembly for adjusting the position of the exposure apparatus with respect to the substrate support module. The adjustment assembly comprises a hydraulic actuator, a hydraulic generator and a conduit, wherein the conduit interconnects said hydraulic actuator and said hydraulic generator for forming a hydraulic system. The exposure apparatus, the frame, the adjustment assembly and the substrate support module are arranged as parts of a series of mechanically linked components. A first part of said series of mechanically linked components comprises the exposure apparatus, and a second part comprises the substrate support module. Said hydraulic actuator is arranged between said first part and said second part. Preferably the hydraulic actuator comprises a first bellows and the hydraulic generator comprises a second bellows.

37 Claims, 4 Drawing Sheets

(58) Field of Classification Search
 USPC .......................................................... 355/72
 See application file for complete search history.

(56) References Cited

U.S. PATENT DOCUMENTS

| | | | |
|---|---|---|---|
| 2008/0013060 A1* | 1/2008 | Ichinose | F16C 29/025 |
| | | | 355/53 |
| 2008/0212083 A1* | 9/2008 | Kwan | G03F 7/70258 |
| | | | 356/124 |
| 2008/0218720 A1 | 9/2008 | Mayama | |
| 2009/0086178 A1 | 4/2009 | Shibazaki | |
| 2010/0322751 A1* | 12/2010 | Bark | H02J 1/14 |
| | | | 414/539 |
| 2011/0085152 A1 | 4/2011 | Nishino et al. | |
| 2011/0196483 A1* | 8/2011 | Forsell | A61M 1/12 |
| | | | 623/3.1 |

OTHER PUBLICATIONS

International Search Report and Written Opinion received for PCT Patent Application No. PCT/EP2017/082892, dated Mar. 22, 2018, 15 pages.

\* cited by examiner

US 10,048,599 B2

ADJUSTMENT ASSEMBLY AND SUBSTRATE EXPOSURE SYSTEM COMPRISING SUCH AN ADJUSTMENT ASSEMBLY

BACKGROUND

The invention relates to a mechanical adjustment assembly and to systems adjusted thereby. In particular a mechanical adjustment assembly for use in systems comprising a series of mechanically interlinked components, in particular systems having components in difficult to approach environments such as but not limited to lithography systems, more in particular systems or mechanical arrangements comprising a frame, a first module connected to said frame, a second module carried by or connected to said frame.

The adjustment assembly according to the invention may be utilized for adjusting e.g. the position of such a second and first module with respect to one another. The system according to the invention is henceforth exemplified, but not limited to, a substrate exposure system comprising a substrate support module and an exposure apparatus, which are connected to a frame. Examples of such substrate exposure systems are lithography systems and inspection systems. The invention further relates to a method for adjusting the position of the exposure apparatus with respect to the substrate support module.

Lithography systems are arranged for projecting a pattern onto target which is usually a flat substrate, such as a silicon wafer. State of the art lithography systems expose the target by means of electromagnetic radiation, in particular light, more in particular UV light, or by means of charged particles, in particular electrons, for projecting said pattern on the flat substrate.

Inspection systems are arranged for exposing a target or sample by means of electromagnetic radiation, in a light microscope, or by means of charged particles, in particular electrons in an electron microscope, and analyzing the absorbed, reflected or emitted radiation or charged particles in order to acquire information from the target.

WO 2013/034753, for example, describes a lithography system, in particular a charged particle multi-beam lithography system, comprising a beam generator for generating a plurality of beams, a beam modulator for modulating the individual beams according to a desired pattern, and a beam projector for projecting the modulated beams onto a surface of a target which is arranged on a target positioning system. The components of a lithography or inspection system for generating and projecting the beams, whether they are charged particle beams, optical beams, or other types of beams, are typically arranged in a column and are usually referred to as the electron-optical column or optical column, and will be referred to herein as the 'exposure apparatus'.

In addition, a lithography or inspection system comprises a substrate support module for holding a substrate at least during an exposure by the exposure apparatus. The substrate support module typically comprises a stage for moving the substrate with respect to the exposure apparatus, a chuck arranged on top of the stage, and a substrate support structure on top of said chuck, as described in WO 2013/034753.

The substrate exposure system as described in WO 2013/034753 comprises a support frame and a support element for holding the exposure apparatus. The support element is connected to the support frame by means of at least one spring element. As described in WO 2013/034753, the spring element is part of a module for at least partially isolating the support element from vibrations.

A disadvantage of the known system is that in use and over time, creep can occur inter alia in the spring element, which results in a deviation of the position of the support element with respect to the support frame from the set position. As a consequence, the position of the support element, and the position of the exposure apparatus held by said support element, with respect to the target on the target positioning system can also deviate from an optimum position in the system. This has an adverse effect on the performance of the system, specifically the exposure of targets.

Another exposure apparatus is known from US2009/0086178. This known system comprises a light source and an illumination optical system which illuminates a reticle. A barrel shaped projection optical system projects an image of the reticle onto a substrate on a wafer stage. The projection optical system is connected to a frame by means of three suspension support mechanism. Three drive mechanism are provided between the frame and projection optical system. Each drive mechanism includes a voice coil motor that drives the projection optical system in a radius direction of the barrel, and a voice coil motor that drives the projection optical system in the direction of an optical axis (the Z-axis direction). With three drive mechanisms, the projection optical system can be moved in the direction of six degrees of freedom.

A disadvantage of this known system is that the actuators which move the exposure apparatus are included as contactless motors and are thus limited in the load that can be carried.

A further disadvantage of substrate exposure systems in general, and lithography or microscopy systems in particular, is that they are highly complex systems in which a large number of components are arranged in a compact and/or enclosed configuration. In such systems it is difficult to adjust the position of a component, in particular when the component is not readily reachable from the outside of the system.

It is an object of the present invention to overcome or at least minimize the effect of one or more of these disadvantages or to at least provide a substrate exposure device comprising an alternative adjustment assembly and/or method for adjusting the position of a component of said substrate exposure device.

SUMMARY OF THE INVENTION

To this end, according to a first aspect, the invention provides substrate exposure system comprising:
 a frame,
 a substrate support module for carrying a substrate, which substrate support module is connected to said frame
 an exposure apparatus, wherein the exposure apparatus is connected to said frame and is arranged for exposing the substrate carried by the substrate support module, and
 an adjustment assembly for adjusting the position of the exposure apparatus with respect to the substrate support module, wherein the adjustment assembly comprises a hydraulic actuator, a hydraulic generator and a conduit, wherein the conduit interconnects said hydraulic actuator and said hydraulic generator for forming a hydraulic system,
 wherein the exposure apparatus, the frame, the adjustment assembly and the substrate support module are arranged as parts of a series of mechanically linked components, wherein said series of mechanically linked components comprises a first part comprising at least the exposure apparatus, and a second part comprising at least the substrate support module, and wherein said hydraulic actuator is arranged between said first part and said second part of said series of the mechanically linked components.

In the substrate exposure system of the present invention, the exposure apparatus, the frame, the adjustment assembly and the substrate support module are arranged as parts of a series of mechanically linked components. In this interconnected arrangement, the hydraulic actuator is arranged between the exposure apparatus and the substrate support module. The hydraulic actuator is arranged to be actuated by the hydraulic generator for adjusting the position of the exposure apparatus and the substrate support module with respect to each other. At least in use, the hydraulic actuator, the conduit and the hydraulic generator are filled with a hydraulic liquid, preferably water, to form a hydraulic system.

The substrate exposure system of the present invention comprises a hydraulic system which allows to adjust the position of a component in the system by means of the hydraulic actuator, which hydraulic actuator is remotely controlled and/or actuated by the hydraulic generator. The hydraulic generator is preferably arranged to be readily accessible from the outside of the system. Accordingly, the adjustment assembly of the present invention makes it easier to adjust the position of a component, for example the exposure apparatus and/or the substrate support module, inside the substrate exposure system, and allows adjusting the position of a component inside the substrate exposure system without requiring access into said system.

Although, up until now, hydraulic systems are not used in substrate exposure systems such as lithography or microscopy systems, for adjusting the position of a component, in particular a component which is arranged within the system, the inventor has realized that the hydraulic system in the substrate exposure system of the invention is highly suitable for adjusting deviations or drift of a position and/or misalignment, for example due to creep which is usually a relatively slow process. In addition, the adjustment assembly according to the present invention provides a hydraulic system that enables the adjustment assembly to carry a high load and providing a stiff support for the exposure apparatus and/or the substrate support module.

In addition, the hydraulic system in the substrate exposure system of the invention provides a remote control and/or actuation of the adjustment assembly without bringing electrical signals and/or electrical fields inside the substrate exposure system. This is highly advantageous for substrate exposure systems which comprise a charged particle exposure apparatus, such as an electron beam lithography system or an electron microscope, because electric or magnetic fields generated by leads carrying electrical signals can disturb the trajectory of the charged particles in such a substrate exposure system. Such a disturbance has an adverse effect on the performance of such a substrate exposure system comprising a charged particle exposure apparatus, specifically on the exposure of targets. In the substrate exposure system according to the present invention, this adverse effect is, at least partially, circumvented by using a hydraulic system for adjusting the position of the exposure apparatus with respect to the substrate support module in a substrate exposure apparatus of the present invention.

In an embodiment, said hydraulic actuator comprises a first bellows. Although said hydraulic actuator may also comprise a hydraulic cylinder for example, the use of a first bellows is advantageous because the hydraulic fluid is better confined within the bellows and a chance of leakage of hydraulic liquid is reduced since a bellows does not have parts that telescope out as in a hydraulic cylinder.

In an embodiment, said hydraulic generator comprises a second bellows. Although said hydraulic generator may also comprise a hydraulic pump for example, the use of a second bellows is advantageous because the hydraulic fluid is better confined within the bellows and a chance of leakage is reduced.

Using first and/or second bellows as an hydraulic actuator and/or hydraulic generator respectively, provides a simple hydraulic system in which the hydraulic fluid is confined within a substantially constant volume as provided by the internal volume in the first and second bellows and in the conduit. When the second bellows is compressed, this induces a flow in the conduit which has the effect of expanding the first bellows. Likewise, expanding the second bellows induces an opposite flow in the conduit thus compressing first bellows.

In an embodiment, the second bellows is provided with a drive unit, preferably a mechanical linear drive unit, wherein the drive unit is arranged to compress or expand the second bellows for actuating the first bellows. The mechanical linear actuator is arranged for compressing and expanding the second bellows, and thus to remotely control an expansion and compression of the first bellows.

In an embodiment, the mechanical linear actuator comprises a manually operable actuator, such as an adjusting screw. In an alternative embodiment, the drive unit comprises a motor, preferably a stepper motor. The motor is arranged to compress and/or expand the second bellows for actuating the first bellows. This enables automated adjustment of the position of the exposure apparatus with respect to the substrate support module, for instance using a control system. Preferably, said control system is connected to a sensor for measuring a position of the exposure apparatus or the support element, with respect to said frame. This allows to measure a deviation of the position of the exposure apparatus, and to control an adjustment of the position of the exposure apparatus with respect to the substrate support module on the basis of the measured deviation.

Accordingly, in an embodiment, the system comprises at least one sensor for measuring a position of said first part with respect to said second part of said series of the mechanically linked components, or for measuring a change in position of said first part of said series of mechanically linked components with respect to the second part of said series of mechanically linked components. This should be construed to encompass that the sensor is arranged to measure a relative position or change of the position of the first part of the mechanically linked components with respect to the second part of the mechanically linked components, and/or is arranged to measure a relative position or change of the position of the second part of the mechanically linked components with respect to the first part of the mechanically linked components.

In an embodiment, the sensor is a capacitive sensor. A capacitive sensor allows to accurately measure the position of the support element with respect to the frame and thus with respect to rest of the system, in particular with respect to the substrate support module, whilst also providing a compact and economical option. In particular the capacitive sensor allows to accurately measure the distance between the support element and the frame. In an embodiment, the system comprises multiple capacitive sensors which are positioned in an arrangement to measure the distance between the support element and the frame, and also a tilt and/or inclination of the support element with respect to the frame.

In an embodiment, the exposure apparatus is moveably connected to the frame by means of at least one spring element. In an embodiment, the first part of said series of mechanically linked components comprises said spring element.

In a first preferred embodiment, the hydraulic actuator is arranged between the frame and said spring element, and is preferably arranged for moving the exposure apparatus with respect to the frame. Accordingly, the hydraulic actuator is arranged to counteract a deviation from set and/or predetermined position of the exposure apparatus with respect to the frame, which deviation is typically induced by creep of the spring element.

In an embodiment, the system comprises at least one sensor, wherein the sensor is arranged for measuring a relative position of said first part with respect to said second part of said series of the mechanically linked components, or for measuring a change in relative position of said first part comprising the exposure apparatus with respect to the second part of said series of mechanically linked components. In particular, in an embodiment, the sensor is arranged for measuring a relative position of the exposure apparatus with respect to a frame segment which is part of the second part of said series of mechanically linked components, or for measuring a change in the position of the exposure apparatus relative to a frame segment which is part of the second part of said series of mechanically linked components.

In an embodiment, the sensor is arranged for measuring a vertical position of said first part with respect to said second part of said series of the mechanically linked components, or for measuring a change in a vertical position of the exposure apparatus with respect to the second part of said series of mechanically linked components. This embodiment is particularly suitable for a system wherein the spring element provides a flexible connection between the exposure apparatus and the second part of the series of mechanically linked components which provides a flexibility in substantially the vertical direction of the exposure apparatus with respect to the second part of the series of mechanically linked components, in particular with respect to the frame segment which is part of the second part of said series of mechanically linked components. The substantial vertical flexibility is preferably arranged for dampening vibrations transmitted from the floor onto which the exposure system is placed. It is noted, that the relatively quick changes in the position of the exposure apparatus with respect to the substrate support module due to these vibrations are counteracted by actuators in the substrate support module. In addition to the possible occurrence of vibrations, the spring element is constantly subjected to a substantially vertical force due to the weight of at least the exposure apparatus. This vertical force may induce creep in the spring element, which is typically a slow process. A deviation in the distance between the exposure apparatus and the substrate support module due to the creep, in particular the vertical deviation in position, is measured by the sensor. When a certain deviation in position is measured, the hydraulic actuator arranged between the frame and said spring element is actuated for moving the exposure apparatus with respect to the frame to suitably counteract the deviation in position. Accordingly, the adjustment assembly of the present invention, in particular the hydraulic system thereof, is typically suitable for compensating deviations in the position of the exposure apparatus with respect to the substrate support module due to slow processes, such as creep.

In a second preferred embodiment, the hydraulic actuator is arranged between the frame and the substrate support module. In this embodiment, the hydraulic actuator is arranged for moving the substrate support module with respect to the frame to suitably counteract a deviation in the relative position of the exposure apparatus with respect to the substrate support module.

In an embodiment, the system comprises at least one sensor, wherein the sensor is arranged for measuring a position of said first part with respect to said second part of said series of the mechanically linked components, or for measuring a change in position of the substrate support module with respect to the first part of said series of mechanically linked components. In an embodiment, the sensor is arranged for measuring a position of said substrate support module with respect to a frame segment which is part of the first part of said series of mechanically linked components, or for measuring a change in position of the substrate support module with respect to a frame segment which is part of the first part of said series of mechanically linked components. In an embodiment, the sensor is arranged for measuring a vertical position or a change in a vertical position of the substrate support module with respect to the first part of said series of mechanically linked components. In an embodiment, hydraulic actuator is arranged for moving the exposure apparatus with respect to the substrate support module, preferably for moving the exposure apparatus with respect to the substrate support module in a substantially vertical direction.

In an embodiment, the hydraulic actuator comprises an end stop, preferably an internal end stop. In an embodiment the first bellows comprises said end stop. This end stop limits the movement of the hydraulic actuator, in particular of the first bellows. Preferably the end stop is arranged to substantially prevent contact between the exposure apparatus and the substrate support module. Accordingly the end stop is arranged to limit the movement of the exposure apparatus towards the substrate support module, or vice versa. When the hydraulic actuator reaches said end stop, the exposure apparatus and the substrate support module are still spaced apart and thus are not in contact with each other. In addition or alternatively, the end stop is arranged to provide a fixed support when the hydraulic system of the adjustment assembly is drained. In this case, the end stop places the support element in a service position when the hydraulic system is emptied, preventing damage to the support frame, the exposure apparatus and/or the first bellows, for example during transport.

In an embodiment, said substrate exposure system further comprises a housing, wherein the exposure apparatus and the substrate support module are at least partially arranged inside said housing, wherein the hydraulic actuator is arranged inside said housing and the hydraulic generator is arranged outside said housing. Certain types of substrate exposure systems require that at least the exposure apparatus is placed inside a chamber to shield the exposure apparatus and/or the substrate from outside influences, such as electric and/or magnetic fields, which may disturb the exposure process. The chamber provides the required shielding from outside influences.

In an embodiment, the housing comprises a wall, and wherein the conduit passes through said wall. This allows the hydraulic actuator to be placed inside the chamber, the hydraulic generator outside the chamber. The conduit connecting the hydraulic actuator and hydraulic generator extends through the wall, for forming the hydraulic system.

In an embodiment, said housing is arranged to function as a vacuum chamber, wherein the housing is coupled to a vacuum pump for, in use, creating a vacuum pressure inside said housing, preferably wherein at least the hydraulic actuator is vacuum compatible. In the case the substrate exposure system comprises a charged particle exposure apparatus or an EUV exposure apparatus, a vacuum environment is required for the exposure apparatus to function. The vacuum chamber allows to establish a vacuum environment at least for the part of the exposure apparatus that is arranged inside the chamber and may also provide the required shielding from outside influences, such as electrical and/or magnetic fields. The vacuum chamber provides suitable environment for the exposure of a substrate in case the substrate exposure system comprises a charged particle lithography system or an EUV lithography system. In an embodiment, the hydraulic actuator, preferably the first bellows, is vacuum compatible.

To increase throughput, i.e. the number of wafers exposed per hour, in particular in a charged particle lithography system or an EUV lithography system, a desire exists to efficiently use the space available in the housing, for example in order to reduce the size of the systems so that more systems can be arranged in a certain area in an industrial environment. This efficient use of space available in the housing, results in reduced and limited access to the exposure apparatus enclosed in the housing. The adjustment assembly according to the present invention allows the adjustment of the position of the exposure apparatus with respect to the substrate support module to be provided by the hydraulic actuator inside the housing, while the actuation of the adjustment assembly is performed by means of the hydraulic generator on the outside of the housing.

In an embodiment, the frame comprises a bottom wall, side walls and an upper wall, wherein the substrate support module is arranged on top of said bottom wall, and wherein the exposure apparatus is connected to one or more of the side walls or to the upper wall. Preferably the side walls of the frame are arranged at least partially around the exposure apparatus. Preferably the bottom wall, side walls and upper wall of said frame are arranged to form a box or part of a box. A frame comprising a bottom wall, side walls and an upper wall, in particular when arranged to form a box or part of a box, can provide a substantially rigid arrangement. When the walls are arranged to form a substantially rectangular box, the rigidity of the frame is enhanced in particular due to the angular arrangement of the various walls of the box and an interconnection of said walls, which can be used as at least part of the frame for supporting the exposure apparatus and/or the substrate support module. Accordingly at least part of the box is part of the series of mechanically linked components.

Preferably, the spring element is also arranged inside said box or said box-shaped frame, in particular between the exposure apparatus and the walls of the box. It is noted that the exposure apparatus and the substrate support module are preferably arranged inside said box.

In an embodiment, the conduit passes through one of said bottom wall, side walls and upper wall of said box or said box-shaped frame. This allows placing the hydraulic actuator inside the box and the hydraulic generator outside the box.

In an embodiment, the box or box-shaped frame is arranged inside said housing, and wherein at least one of said bottom wall, side walls and upper wall of said box is provided with an array of through openings. The through openings are particularly suitable when the housing is arranged to function as a vacuum chamber. The through openings are arranged to provide flow path from the inside of the box to the outside of the box. When the housing is coupled to a vacuum pump and the vacuum pump is activated for, in use, creating a vacuum pressure inside said housing, the flow path from the inside of the box to the outside of the box enables to create a vacuum pressure inside said box.

In an embodiment, at least one of said bottom wall, side walls and upper wall is provided with a shielding layer, wherein said shielding layer preferably comprises a layer of a p-metal. The shielding layer is arranged for at least partially shielding a space inside said frame from external magnetic fields. This embodiment is particularly useful for an exposure apparatus using charged particles for exposing a substrate. The shielding layer is preferably arranged to reduce the magnetic fields, both static and dynamic at the exposure apparatus and the substrate support module arranged inside said box, to at least substantially prevent unwanted deflections of said charged particles and thereby beam position errors on the substrate.

In an embodiment, the exposure apparatus is arranged inside an enclosure, wherein said enclosure is movably connected to said frame. Said enclosure preferably substantially surrounds said exposure apparatus. In an embodiment, the enclosure is connected to said spring element.

In an embodiment, the enclosure is arranged inside said housing, wherein said enclosure comprises at least one wall which is provided with an array of through openings. In an embodiment, the enclosure is arranged inside said box inside said housing, and wherein said enclosure comprises at least one wall which is provided with an array of through openings. The through openings are particularly suitable when the housing is arranged to function as a vacuum chamber. The through openings are arranged to provide flow path from the inside of the enclosure to the outside of the enclosure. When the housing is coupled to a vacuum pump and the vacuum pump is activated for, in use, creating a vacuum or reduced pressure inside said housing, the flow path from the inside of the enclosure to the outside of the enclosure enables to create a vacuum pressure inside said enclosure.

In an embodiment, said enclosure is provided with a shielding layer, wherein said shielding layer preferably comprises a layer of a p-metal. This embodiment is particularly useful for an exposure apparatus using charged particles for exposing a substrate. The shielding layer is preferably arranged to reduce the magnetic fields, both static and dynamic at the exposure apparatus and the substrate support module arranged inside said box, to at least substantially prevent unwanted deflections of said charged particles and thereby beam position errors on the substrate.

In an embodiment, said substrate exposure system comprises three adjustment assemblies. In an embodiment, said three adjustment assemblies are arranged to form a triangle around said exposure apparatus and/or said substrate support module. In an embodiment, the three adjustment assemblies are connected to and/or (partially) supporting said exposure apparatus and/or said substrate support module. This provides three degrees of freedom for adjusting the position of the exposure apparatus and the substrate support module with respect to each other. In case each one of the three adjustment assemblies is arranged such that the first bellows provides a displacement in a substantial vertical direction, the three adjustment assemblies provide an adjustment in the vertical Z-direction, and a tilt around the horizontal X and Y axis, providing 3 degrees of freedom.

In an embodiment, the system is a lithography system and wherein the exposure apparatus comprises an optical column of said lithography system.

In an embodiment, the exposure apparatus comprises a charged particle beam optical column. In an embodiment, the exposure apparatus comprises a multi-beam charged particle optical column. Such a multi-beam charged particle lithographic apparatus comprises a beam generator for generating a plurality of charged particle beams; a beam blanker array for switching the plurality of charged particle beams on or off in accordance with a pattern; and a projection system for projecting the patterned beams onto a target provided on the substrate support module.

According to a second aspect, the present invention provides a method for adjusting the position of the exposure apparatus with respect to the substrate support module in a substrate exposure system as described above, wherein the method comprises the step of:

driving the hydraulic generator for actuating the hydraulic actuator which provides a change in relative position of the said first part with respect to said second part of said series of the mechanically linked components.

In an embodiment, said method further comprises the step of measuring a position of said first part with respect to said second part of said series of the mechanically linked components or measuring a change in position of the said first part with respect to said second part of said series of the mechanically linked components.

In an embodiment, said method further comprises the steps of:

generating a control signal in accordance with said measured position or change in position, and driving the hydraulic generator in accordance with said control signal.

According to a third aspect, the present invention provides a mechanical adjustment assembly for adjusting a position of a first part of a series of mechanically linked components with respect to a second part of a series of mechanically linked components, wherein said mechanical adjustment assembly comprises a first bellows, a second bellows and a conduit, wherein the conduit interconnects said first bellows and said second bellows for forming a hydraulic system, wherein said first bellows is arranged between said first part and said second part of said series of the mechanically linked components, wherein the second bellows is arranged spaced apart from said first bellows, and wherein the first bellows is arranged to be actuated by said second bellows.

Preferably, the mechanical adjustment assembly is used in, but not limited to, a substrate exposure system. Accordingly, in an embodiment, said series of mechanically linked components comprises an exposure apparatus, a frame, the mechanical adjustment assembly and a substrate support module. Preferably, said first part of said series of mechanically linked components comprises at least the exposure apparatus, and a second part of said series of mechanically linked components comprises at least the substrate support module.

According to a fourth aspect, the present invention provides a mechanical system comprising a series of mechanically linked components and a mechanical adjustment assembly, wherein said mechanical adjustment assembly comprises a first bellows, a second bellows and a conduit, wherein the conduit interconnects said first bellows and said second bellows for forming a hydraulic system, wherein said series of mechanically linked components comprises a first module and a second module, and wherein the first bellows is arranged between said first module and said second module for adjusting a position of said first module with respect to said second module, and wherein the second bellows is arranged spaced apart from said first bellows, and wherein the second bellows is arranged for actuating by said first bellows.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
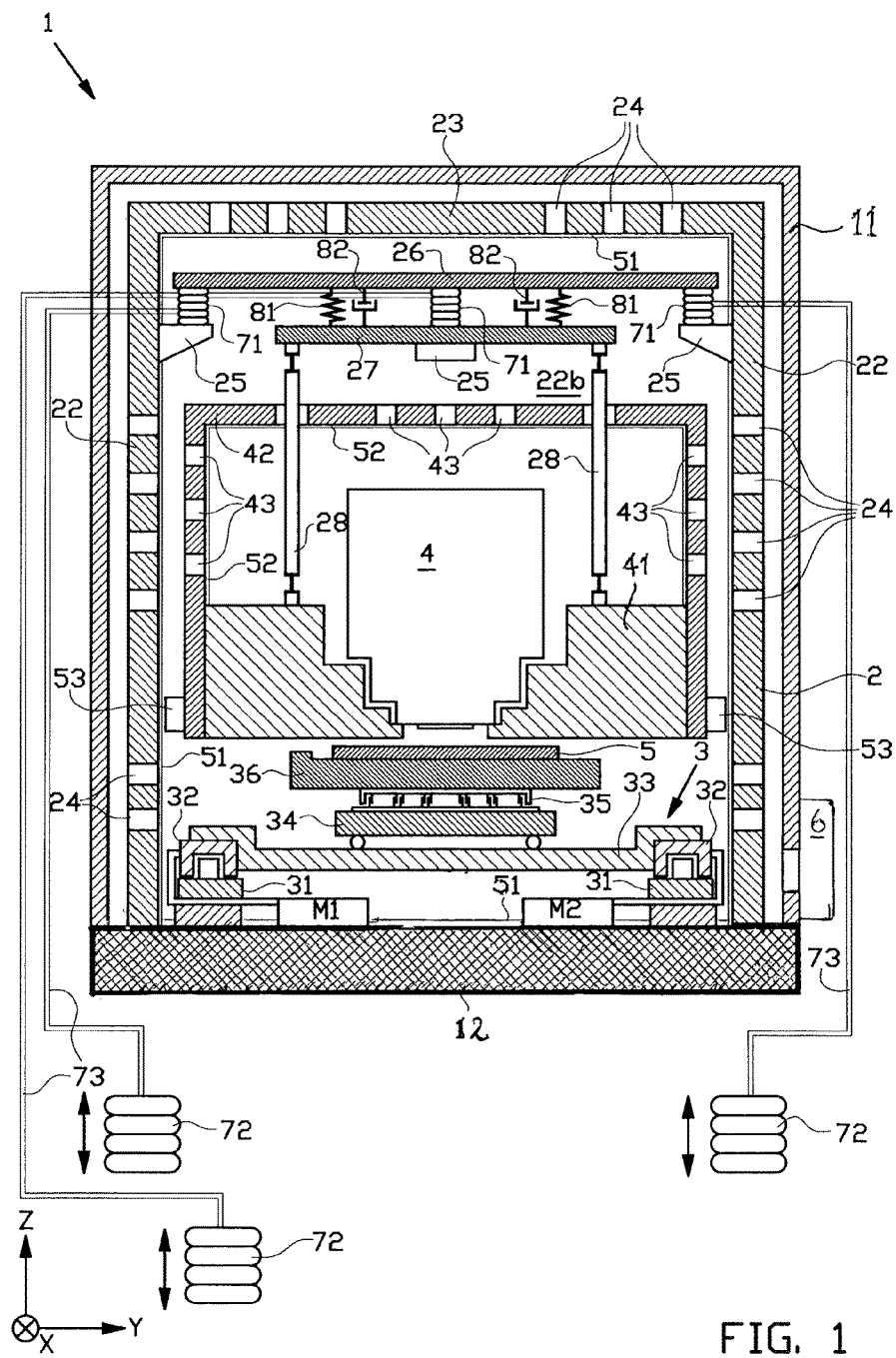
FIG. 1 schematically shows a first example of a substrate exposure system according to the present invention.

FIG. 1 schematically shows a first example of a substrate exposure system 1 according to the present invention. It is noted that in FIG. 1, the vertical corresponds to the Z-direction, whereas the horizontal direction shown in FIG. 1 corresponds to the Y-direction. The X-direction is perpendicular to both the Y-direction and the Z-direction and extends into and out of the paper.

The substrate exposure system 1 comprises a frame 2, a substrate support module 3 for carrying a substrate 5, and an exposure apparatus 4 for projecting a beam or multiple beams of electromagnetic radiation or charged particles onto said substrate 5.

In particular the substrate exposure system 1 comprises a housing 11 which substantially encloses the exposure apparatus 4 and the substrate support module 3. When the exposure apparatus 4 is arranged for using UV, deep UV or X-ray beams or charged particle beams, the housing 11 is suitably arranged to function as a vacuum chamber, wherein, in use, the housing 11 is coupled to a vacuum pump 6 for creating a vacuum or reduced pressure inside said housing 11.

Inside said housing 11, a frame 2 is arranged. In this example, the frame 2 and the housing 11 share a common bottom wall 12. The frame 2 further comprises side walls 22, a rear wall 22*b* and an upper wall 23. The frame 2 comprises two side walls 22 and a rear wall 22*b*, which are at a lower side connected to the common bottom wall 12 and at the upper side connected to the upper wall 23. In an embodiment, the side walls 22 can be arranged spaced apart from each other. However in the example shown in FIG. 1, the common bottom wall, the two side walls 22, the rear wall 22*b* and the upper wall 23 are connected to each other to provide a box-shaped frame 2, preferably a rectangular box-shaped frame 2.

As shown in FIG. 1, the at least the side walls 22 and the upper wall 23 are provided with through openings to provide a flow path between the inside and the outside of the box-shaped frame 2, in order to create also a vacuum or reduced inside said box-shaped frame 2 when the vacuum pump 6 is used for creating a vacuum or reduced pressure inside said housing 11.

The substrate support module 3 is arranged on and/or connected with the common bottom wall 12 of the box-shaped frame 2. The substrate support module 3 comprises an XY-stage comprising two X-stage bases 31, both arranged on top of the bottom wall 12 of the box-shaped frame 2. The X-stage bases 31 are arranged spaced apart and extend parallel to each other in the X-direction. Each X-stage base 31 carries an X-stage carriage 32. Each X-stage carriage 32 is connected to a respective actuator M1, M2 for driving the respective X-stage carriage 32 along the X-stage base 31. On top of said X-stage carriages 32, a Y-beam 33 is arranged, which bridges the space between the X-stage carriages 32. The Y-beam is preferably connected to the X-stage carriages 32 via flexures (also denoted as flextures) as for example described in WO2010/021543A1, which is incorporated herein by reference.

On top of said Y-beam 33, an Y-beam carriage 34 is arranged including actuators (not shown) for driving the Y-beam carriage 34 along the Y-beam, using for example a short stroke actuator or piezoelectric motors as described in WO2010/021543A1.

On top of said Y-beam carriage 34 a positioning device 35 is arranged for moving a chuck 36 in the X, Y and/or Z-direction and in one or more rotational directions Rz, Rx, Ry. The positioning device 35 typically comprises electromotors, preferably linear motors, and preferable comprising Lorentz-type actuators. As indicated in FIG. 1, on top of said positioning device 35 a chuck 36 is arranged for carrying a substrate 5.

As further shown in FIG. 1, the side walls 22 and the rear wall 22*b* of the box-shaped frame 2 are provided with brackets 25, which are rigidly connected to their respective wall 22, 22*b*. As viewed from the front side as depicted in FIG. 1, the box-shaped frame 2 is provided with three brackets 25, one on each left and right side wall 22 as depicted in FIG. 1 and one on the backward side wall 22*b*.

On top of each of said brackets 25, a first bellows 71 is arranged, which first bellows 71 are arranged for supporting a first support member 26. The first support member 26 is connected to a second support member 27 via spring elements 81. Furthermore dampening elements 82 are arranged between the first and second support members as shown in the example of FIG. 1. The spring elements 81 and dampening elements 82 are arranged for at least partially isolating the second support element 27 from vibrations.

As shown in FIG. 1, the exposure apparatus 4 is arranged on an exposure apparatus frame 41, which exposure apparatus frame 41 is connected to the second support member 27 by means of a plurality of pendulums rods 28. In the example shown in FIG. 1, two pendulums rods 28 are depicted. However in a further example the exposure apparatus frame 41 may be connected to the second support member 27 by three pendulums rods 28.

The exposure apparatus 4 is arranged inside an enclosure 42, which substantially surrounds said exposure apparatus 4. In the example shown in FIG. 1, the enclosure 42 is connected to the exposure apparatus frame 41, in particular the exposure apparatus frame 41 is part of the enclosure and is arranged as a bottom wall of the enclosure 42. The enclosure 42 is connected to the exposure apparatus frame 41, which is connected to the second support member 27 by means of the pendulum rods 28, which second support member 27 is connected to said spring elements 81. Accordingly, the enclosure 42 is connected to said spring elements 81.

As shown in the example of FIG. 1, the enclosure 42 is arranged inside said housing 11, in particular inside said box-shaped frame 2 inside said housing 11. Also the enclosure 42 comprises at least one wall which is provided with an array of through openings 43. The through openings 43 are particularly suitable when the housing 11 is arranged to function as a vacuum chamber. The through openings 43 are arranged to provide a flow path from the inside of the enclosure 42 to the outside of the enclosure 42. When the vacuum pump 6 is activated for, in use, creating a vacuum or reduced pressure inside said housing 11, the flow path from the inside of the enclosure 42 to the outside of the enclosure 42, and from the inside of the box-shaped frame 2 to the outside of the box-shaped frame 2 enables to create a vacuum pressure inside said box-shaped frame 2 and inside said enclosure 42.

In the example showed in FIG. 1 both the box-shaped frame 2 and the enclosure 42 are provided with a shielding layer 51, 52 for shielding the exposure apparatus 4 from magnetic fields, which shielding layer 51, 52 preferably comprises a layer of a p-metal.

As described above, the substrate support module 3 is connected to the exposure apparatus 4 via a series of mechanically linked components. This series of mechanically linked components comprises the common bottom wall 12 of the box-shaped frame 2, the side walls 22 and rear wall 22*b* of the box-shaped frame 2, the brackets 25, the first bellows 71, the first support member 26, the spring elements 81 and dampening elements 82, the second support member 27, the pendulums rods 28, and the exposure apparatus frame 41.

As already discussed in the introductory part of this description, in use and over time, creep can occur inter alia in the spring elements 81, which results in a deviation of the position of the exposure apparatus 4 with respect to the substrate support module 3 from the set position. In order to compensate said creep, the substrate exposure system 1 comprises an adjustment assembly for adjusting the relative position of the exposure apparatus 4 with respect to the substrate support module 3. The adjustment assembly as shown in FIG. 1 comprises the first bellows 71, which are arranged for moving a first part of the series of mechanically linked components with respect to a second part of the series of mechanically linked components. In particular, the first part of the series of mechanically linked components comprises the first support member 26, the spring elements 81 and dampening elements 82, the second support member 27, the pendulums rods 28, the exposure apparatus frame 41, and the exposure apparatus 4. The second part of the series of mechanically linked components comprises the brackets 25, the sidewalls 22 and rear wall 22*b* of the box-shaped frame 2, the bottom wall 12 of the box-shaped frame 2, and the substrate support module 3. By actuating the first bellows 71, the first part of the series of mechanically linked components can be moved with respect to the second part of the series of mechanically linked components. As shown in FIG. 1 the first bellows 71 are connected to second bellows 72 by means of conduits 73. The first bellows 71 are arranged to act as an hydraulic actuator which can be actuated by said second bellows 72 which are arranged to act as an hydraulic generator. The combination of a first bellows 71 and a second bellows 72 which are interconnected by a conduit 73, which first bellows 71, second bellows 72 and conduit 73 are, at least in use, filled with a hydraulic fluid, provides a simple hydraulic system in which the hydraulic fluid is confined within a substantially constant volume as provided by the internal volume in the first bellows 71, second bellows 72 and in the conduit 73. When the second bellows 72 is compressed, this induces a flow in the conduit 73 which has the effect of expanding the first bellows 71. Likewise, expanding the second bellows 72 induces an opposite flow in the conduit 73 which has the effect of compressing first bellows 71.

As schematically indicated in FIG. 1, the conduits 73 are arranged to traverse through a wall of the housing 11 for connecting the first bellows 71 inside the housing 11 to the second bellows 72 outside said housing 11. Preferably the conduits 73 are arranged to traverse through a wall of the box-shaped frame 2 for connecting the first bellows 71 inside the box-shaped frame 2 to the second bellows 72 outside said box-shaped frame 2. The second bellows 72 are readily accessible at the outside of the housing 11 and can be actuated at the outside of the housing 11 in order to activate the first bellows 71 inside said housing 11 to move and/or re-adjust the position of the exposure apparatus 4 with respect to the substrate support module 3. Because of the arrangement of three first bellows 71 which are arranged around the exposure apparatus 4 in a triangular configuration, the three first bellows 71 can move the first support member 26 to translate in the Z-direction, to tilt around the X-direction and/or around the Y-direction.

As shown in FIG. 1, the system 1 is provided with sensors 53, which are arranged to measure the position or change in position of the enclosure 42 relative to a side wall 22 of the box-shaped frame 2. In particular, the sensors 53 are connected to the outer side of the enclosure 42 and measure their distance to the side wall 22 of the box-shaped frame 2, in particular their distance to a target (not shown) arranged at a fixed position on the side wall 2 of the box-shaped frame 2. Alternatively, the sensors 53 can also be connected to the inner side of the side wall 22 of the box-shaped enclosure and measure their distance to the outer side of the enclosure 42. It is noted that the enclosure 42 belongs to the first part of said series of mechanically linked components, and the side walls 22 of the box-shaped frame 2 belong to the second part of said series of mechanically linked components. In particular, the sensors 53 are arranged for measuring a position or a change in position of the exposure apparatus 4 with respect to a side wall 22 of the box-shaped frame 2 which is part of the second part of said series of mechanically linked components.

The sensors 53 are arranged for measuring at least a vertical position or a change in the vertical position of the exposure apparatus 4 with respect to a fixed position along the side wall 22 of the box-shaped frame 2. Since the spring elements 81 provide an elastic connection between the exposure apparatus 4 and the frame 2, which elastic connection provides a flexibility which is substantial in the vertical or Z-direction. The spring elements 81 are constantly subjected to a substantially vertical force due to the weight of the second support member 27, the pendulums rods 28, the exposure apparatus frame 41, the enclosure 42 and the exposure apparatus 4. This vertical force may induce creep in the spring elements 81, which results in a deviation in the distance between the exposure apparatus 4 and the substrate support module 3, in particular the chuck 36 which in use carries the substrate 5, which deviation is measured by the sensors 53. When a certain deviation in position is measured, one or more of said first bellows 71 arranged between the frame 2 and said spring element 81 are actuated by actuating the corresponding one or more of said second bellows 72 outside the exposure system 1 for moving the exposure apparatus 4 with respect to the frame 2 to suitably counteract the deviation in position due to said creep.

Preferably, as schematically shown in FIG. 1, the system 1 is provided with three sensors 53, one on the left side of the enclosure 42, one on the right side of the enclosure 42, and one on the back side of the enclosure 42 (not shown). Each one of said sensors 53 is preferably arranged so that said sensors 53 measures at least a vertical position along the Z-axis. The sensors 53 may also comprise a further arrangement in order to measure also a horizontal position along the X-axis and/or a horizontal position along the Y-axis. For example, each of said sensors 53 may comprise two detectors which are arranged substantially perpendicular to each other. The sensor 53 shown on the left hand side of the enclosure 42 in FIG. 1, comprises two detectors for measuring a position along the X-axis and Z-axis. The sensor 53 shown on the right hand side of the enclosure 42 in FIG. 1, comprises two detectors for measuring a position along the X-axis and Z-axis. The sensor on the rear side of the enclosure 42 (not shown), comprises two detectors for measuring a position along the Y-axis and Z-axis. Each of said sensors 53 is arranged to measure a position of said sensor with respect to a target fixed to the side wall 22 and rear wall 22b of the box-shaped frame 2. However for the adjustment assembly of the present invention, in particular the three sensors 53 for measuring the position along the Z-axis are of importance.

Preferably, the system 1 is provided with a control unit which is arranged to receive positional data from the sensor assemblies 53, and which is arranged to control a set of drive units, preferably one for each second bellows 72, for actuating said drive units to drive the second bellows 72 for actuating the first bellows 71 based on the data from the sensors 53. Such a control system is schematically shown in FIG. 2.

It is noted that in case the exposure system 1 does not require a vacuum environment to operate, for example when the exposure system 4 is an optical system using light for exposing a substrate 5, the walls 21, 22, 23 of the box-shaped frame 2 do not need to be provided with holes 24, and also the walls of the enclosure 42 do not need to be provided with holes 43.

It is further noted that in the example shown in FIG. 1, the housing 11 and the box-shaped frame 2 share a common bottom wall 12 or base-plate. Alternatively, the housing 11 may comprise its own bottom wall 111, and the box-shaped frame 2 also may comprise its own bottom wall 21, which bottom walls 111, 21 may be separated by interconnecting elements 112 arranged between the housing 11 and the frame 2, as for shown in the second example of FIG. 2.

Figure 2:
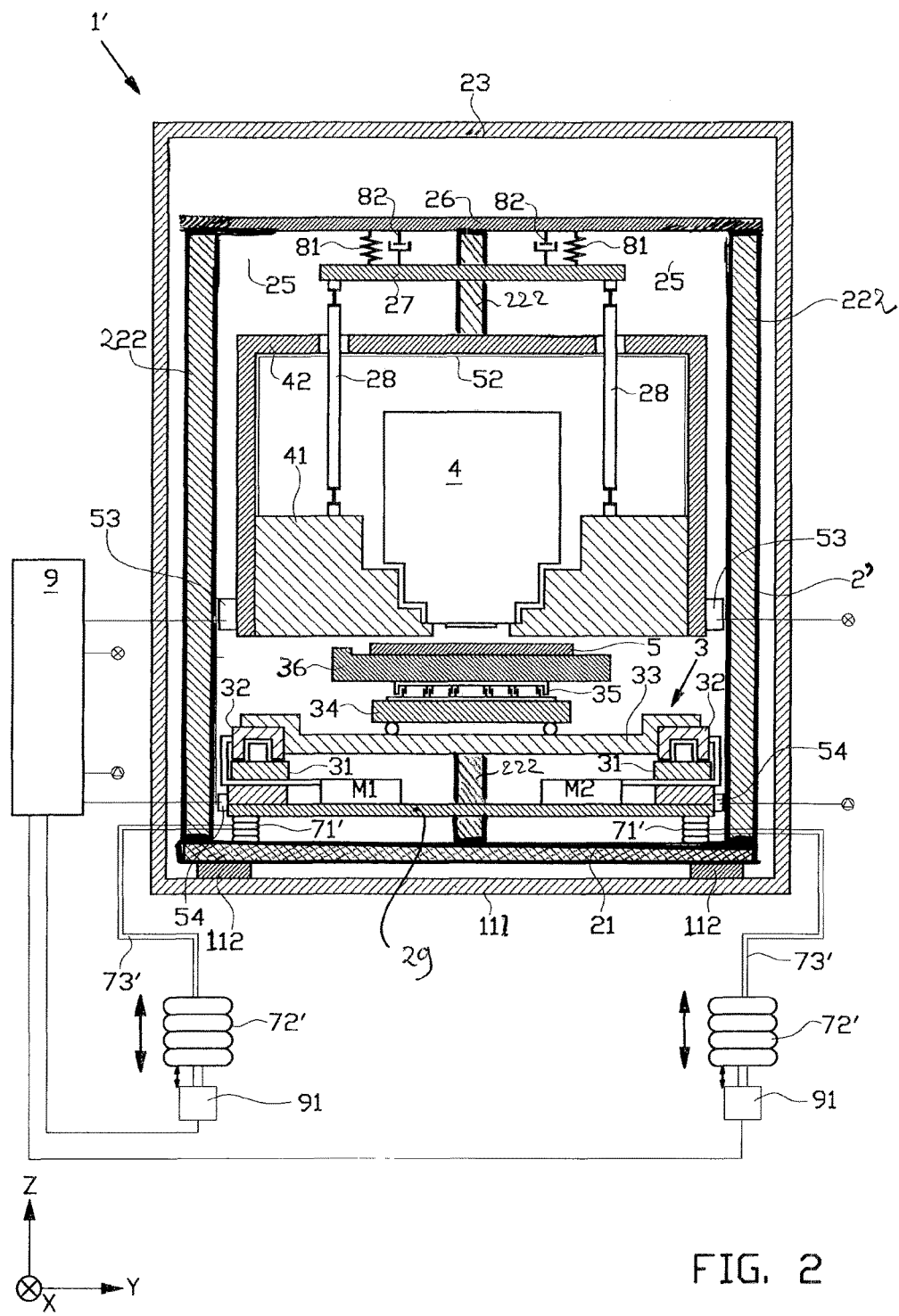
FIG. 2 schematically shows a second example of a substrate exposure system according to the present invention.

FIG. 2 shows a second example of a substrate exposure system 1' according to the present invention. In this second example the substrate support module 3 is arranged on top of a third support member 29. Underneath the third support member 29 several first bellows 71' are arranged, which first bellows 71' are arranged between the bottom wall 21 of the frame 2' and the third support member 29. The first bellows 71' are connected with the second bellows 72' via conduits 73' to form an hydraulic system which allows to move the third support member 29 with respect to the bottom wall 21 of the frame 2'.

In addition, the first support member 26 is arranged on top of three support posts 222. The three support posts 222 are arranged at the corner points of a triangle on top of a frame bottom wall 21, and extend in the Z-direction, substantially perpendicular the frame bottom wall 21. Preferably, the exposure apparatus 4 is arranged substantially at a center point of said triangle formed by the three support posts 222. Accordingly, the substrate support module 3 is connected to the exposure apparatus 4 via a series of mechanically linked components. This series of mechanically linked components comprises the third support member 29, the first bellows 71', the bottom wall 21 of the frame 2', the support posts 222 of the frame 2', the first support member 26, the spring elements 81 and dampening elements 82, the second support member 27, the pendulums rods 28, and the exposure apparatus frame 41. In use and over time, creep can occur inter alia in the spring elements 81, which results in a deviation of the position of the exposure apparatus 4 with respect to the substrate support module 3 from the set position. In order to compensate said creep, the substrate exposure system 1 comprises an adjustment assembly for adjusting the relative position of the exposure apparatus 4 with respect to the substrate support module 3. The adjustment assembly as shown in FIG. 2 comprises the first bellows 71', which are arranged for moving a first part of the series of mechanically linked components with respect to a second part of the series of mechanically linked components. In particular, the first part of the series of mechanically linked components comprises the bottom wall 21 of the frame 2', the support posts 222 of the frame 2', the first support member 26, the spring elements 81 and dampening elements 82, the second support member 27, the pendulums rods 28, the exposure apparatus frame 41, and the exposure apparatus 4. The second part of the series of mechanically linked components comprises the third support member 29 and the substrate support module 3. By actuating the first bellows 71', the second part of the series of mechanically linked components can be moved with respect to the first part of the series of mechanically linked components. As shown in FIG. 2 the first bellows 71' are connected to corresponding second bellows 72' by means of conduits 73'. The first bellows 71' are arranged to act as an hydraulic actuator which can be actuated by said second bellows 72' which are arranged to act as an hydraulic generator. The combination of a first bellows 71' and a second bellows 72' which are interconnected by a conduit 73', which first bellows 71', second bellows 72' and conduit 73' are, at least in use, filled with a hydraulic fluid, provides a simple hydraulic system in which the hydraulic fluid is confined within a substantially constant volume as provided by the internal volume in the first bellows 71', second bellows 72' and in the conduit 73'. When the second bellows 72' is compressed, this induces a flow in the conduit 73' which has the effect of expanding the first bellows 71' and moving the third support member 29 in upward direction. Likewise, expanding the second bellows 72' induces an opposite flow in the conduit 73' which has the effect of compressing first bellows 71' and moving the third support member 29 in a downward direction.

As schematically indicated in FIG. 2, the conduits 73' are arranged to traverse through a wall of the housing 11 for connecting the first bellows 71' inside the housing 11 to the second bellows 72' outside said housing 11. Preferably the conduits 73' are arranged to traverse in a sideward direction past the support posts 222 of the frame 2' for connecting the first bellows 71' inside the frame 2' to the second bellows 72' outside said frame 2'. The second bellows 72' are readily accessible at the outside of the housing 11 and can be actuated at the outside of the housing 11 in order to activate the first bellows 71' inside said housing 11 to move and/or re-adjust the position of the substrate support module 3 with respect to the exposure apparatus 4. In the example shown in FIG. 2 the first bellows 71' are arranged substantially directly below the X-stage bases 31.

As shown in FIG. 2, the system 1' is provided with sensors 53, which are arranged to measure the position or change in position of the enclosure 42 relative to a support post 222 of the frame 2', in a same manner as in the previous example. However the example in FIG. 2 comprises further sensors 54, which further sensors 54 are connected to the outer side of the third support member 29 and/or the X-stage bases 31 and are arranged to measure their distance to the support posts 222 of the frame 2'. Alternatively, the further sensors 54 can also be connected to the inner side of the support posts 222 of the frame and measure their distance to the outer side of the third support member 29 and/or the X-stage bases 31. In particular, the further sensors 54 are arranged for measuring a position or a change in position of the substrate support module 3 with respect to a support post 222 of the frame 2'.

The further sensors 54 is arranged for measuring at least a vertical position or a change in the vertical position of the substrate support module 3 with respect to a fixed position along the support posts 222 of the frame 2'. The spring elements 81 provide an elastic connection between the exposure apparatus 4 and the frame 2', which elastic connection provides a flexibility which is substantially in the vertical or Z-direction. The spring elements 81 are constantly subjected to a substantially vertical force due to the weight of the second support member 27, the pendulums rods 28, the exposure apparatus frame 41, the enclosure 42 and the exposure apparatus 4. This vertical force may induce creep in the spring elements 81, which results in a deviation in the position of the exposure apparatus 4 along the support posts 222 of the frame 2', which deviation is measured by the sensors 53. When a certain deviation in position is measured, one or more of said first bellows 71' are actuated by actuating the corresponding one or more of said second bellows 72' outside the exposure system 1' for moving the substrate support module 3 with respect to the frame 2' to provide a substantially similar deviation in position of the support module 3 along to the frame 2' as measured by the further sensors 54 as the deviation in position of the exposure apparatus 4 along to the frame 2' as measured by the sensors 53.

As schematically shown in FIG. 2, but also applicable in the example of FIG. 1, the sensors 53 are coupled to a control unit 9 to supply positional data of the relative position of the exposure apparatus 4 with respect to the support posts 222 of the frame 2'. In addition the further sensors 54 are in this example also coupled to the control unit 9 to supply positional data of the relative position of the substrate support module 3 with respect to the support posts 222 of the frame 2'. From the positional data of the sensors 53 and the further sensors 54, the control unit 9 can determine the relative position of the exposure apparatus 4 with respect to the substrate support module 3, in particular the chuck 36 which in use carries the substrate 5. In addition, the control unit 9 is coupled to drive units 91, in particular one drive unit 91 for each of the second bellows 72', wherein each drive unit 91 is arranged to compress or expand the corresponding second bellows 72' for actuating the corresponding first bellows 71'.

When the control unit 9 finds a deviation in the relative position of the exposure apparatus 4 with respect to the substrate support module 3 compared to a set position, the control unit 9 sends a control signal to one or more of the drive units 91 for actuating said drive units 91 to compress or expand the corresponding second bellows 72' for actuating the first bellows 71' in order to move the third support member 29 and the substrate support module 3 in order to compensate said deviation in the relative position of the exposure apparatus 4 with respect to the substrate support module 3. As schematically shown in the example of FIG. 2, the drive unit 91 comprises a linear actuator, wherein the drive unit 91 comprises a motor, preferably a stepper motor, for moving the linear actuator.

It is noted, that the motors or stepper motors for driving the drive units 91 are arranged outside the housing 11 and outside the enclosure 42. At least the enclosure 42 is provided with a shielding layer 51, 52, wherein said shielding layer 52 preferably comprises a layer of a p-metal for shielding the interior of the enclosure 42 from electric field and/or magnetic fields. As the motors for the drive units 91 are arranged outside said shielding layer 52, the interior of the enclosure is suitably shielded from any electric and/or magnetic fields generated by the motors.

It is further noted, that the arrangement of a control unit coupled to drive units for each second bellows, can also be used in the first example shown in FIG. 1.

It is furthermore noted, that the present invention can be used with various configurations of the frame 2, 2'. In the first example, the frame 2 is a box-shaped frame where the exposure apparatus 4 is carried by brackets 25 attached to the side walls 22, 22b. Instead of positioning the first bellows 71 on top of the brackets 25 as in the first example, the first bellows may also or in addition be provided below the substrate support module 3. In the second example, the frame 2 comprises three support posts 222 in a triangular arrangement for carrying the exposure apparatus 4. Instead of position the first bellows 71' below the substrate support module 3 as in the second example, the first bellows may also or in addition be provided on top of said three support posts 222.

It is furthermore noted that in the example shown in FIG. 2, interconnecting elements 112 are arranged between the housing 11 and the frame 2. Alternatively however, the frame 2 and the housing 11 may share a common bottom wall as shown in the first example in FIG. 1.

Figure 3:
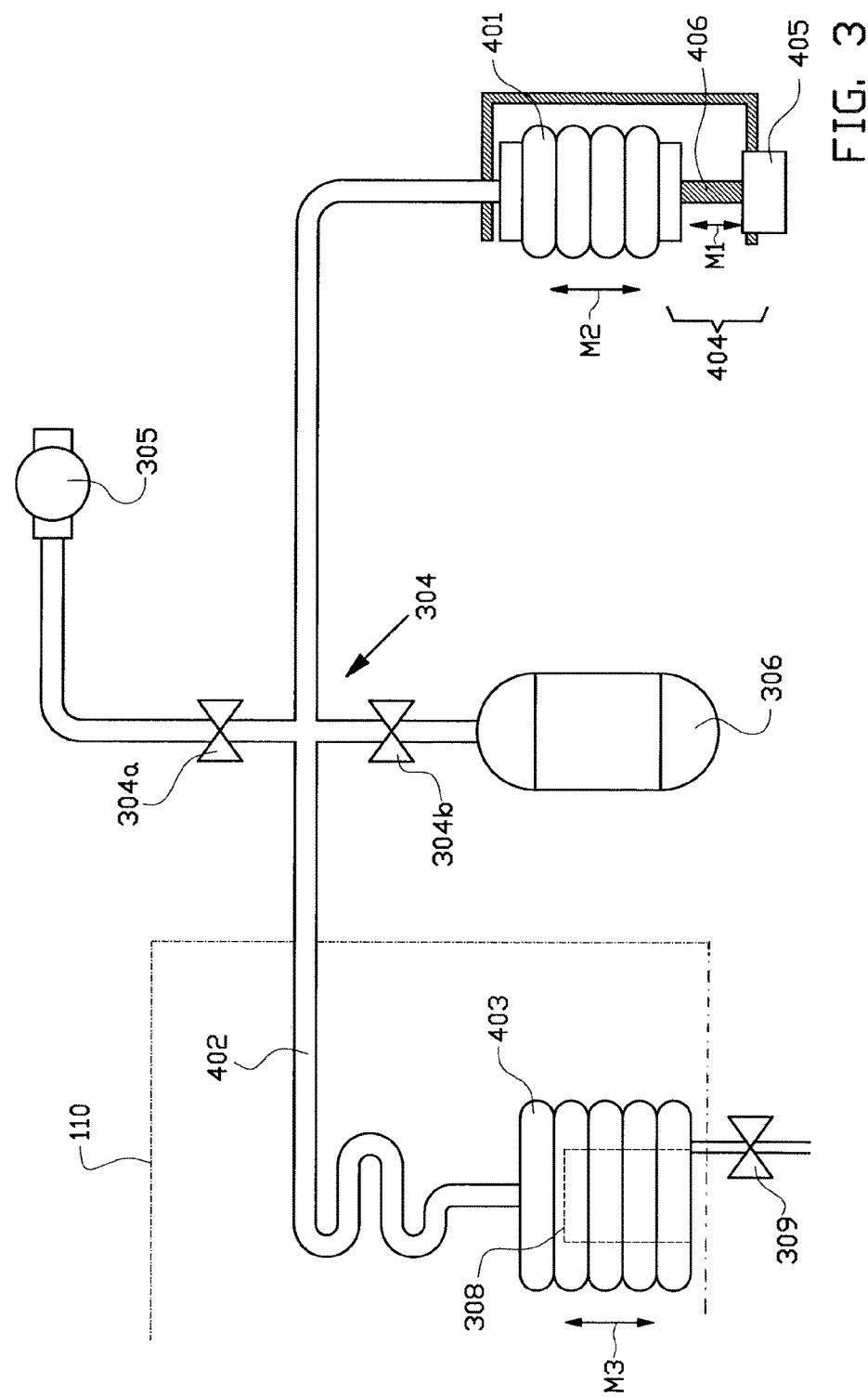
FIG. 3 schematically shows an example of a hydraulic system according to the present invention.

FIG. 3 schematically shows an example of one of the adjustment assembly comprising a hydraulic system according to the invention. Typically, three of such hydraulic systems are used per adjustment assembly. Three hydraulic systems enable the support element to be adjusted in three degrees of freedom i.e. the Z direction and rotations around the X axis (Rx) and rotations around the Y axis (Ry). The adjustment assembly again comprises a first bellows 403. This bellows is placed inside the exposure system, for example the exposure system of FIG. 1 or 2, or inside an enclosure or housing, schematically represented by the dotted line 110, depending on what is required for the system in which the adjustment assembly is placed.

The inner volume of the first bellows 403 is arranged in fluid connection with a conduit 402 for interconnecting with the inner volume of the second bellows 401. First bellows 403, conduit 402 and second bellows 401 are preferably filled with a liquid, preferably water for forming a hydraulic system. When the second bellows 401 is compressed, hydraulic fluid flows from the second bellows 401 through the conduit 402 into the first bellows 403 which has the effect of expanding the first bellows 403. Likewise, expanding the second bellows 401 induces an opposite flow in the conduit 402 and thus compressing the first bellows 403. This arrangement enables adjustment of the transfer ratio between the first and second bellows by varying the diameters and thus the internal volume both of the second bellows 401 and the first bellows 403. The ratio between the volumes of the bellows will determine the transfer ratio. For a ratio I, when the second bellows 401 is compressed over a distance S1, the first bellows 403 will expand over a distance S1/I. Conversely, the force F1 required to compress the second bellows 401 over a distance S1, will result in a force F1*I being exerted at the first bellows 403. It is thus possible to provide a larger or much larger force at the first bellows 403 than is applied at the second bellows 401.

The second bellows 401 can be actuated to allow adjustment of a support element carried by the first bellows 403, as for example described above with reference to the FIGS. 1 and 2. In an embodiment, the second bellows 401 is actuated with an actuator mechanism 404. The actuator mechanism 404 comprises, for example, a mechanical linear actuator 405. The mechanical linear actuator converts a rotary motion into a linear motion m1. The linear motion m1 can be used to expand or compress m2 the second bellows 401, which in turn provides a compression or expansion m3 of the first bellows 403. Preferably, a self-locking mechanical linear actuator 405 is used, comprising a threaded screw 406 that contacts the second bellows 401 and is arranged to compress the second bellows 401. The threaded screw 405 is preferably arranged to rotate in a threaded nut that is in a fixed position in relation to the second bellows 401. The pitch of the threaded screw 405 and nut are such that a high mechanical advantage is provided, such that when the rotational force on the screw 405 is removed, the mechanical linear actuator 404 will remain in the set position to maintain the position of first bellows 403 and the support element it carries.

In one embodiment, the mechanical linear actuator 404 is manually actuated. Alternatively, the mechanical linear actuator 404 is be actuated by a motor (not shown) instead of manual adjustment, preferably a stepper motor, for driving a rotation of the threaded screw 405. The step motor provides the mechanical linear actuator with small and discrete steps of adjustment. This enables automated adjustment of the position of the support element in small increments, for instance using a control system. Since the screw mechanism in the mechanical linear actuator acts as a force multiplier, large mechanical ratios are obtained, up to 1:1000. Further, since an expansion or compression of second bellows 401 will result in an expansion or compression of the first bellows 403 that is I times smaller, it is possible to accurately control the movement of first bellows 403. In practice, the adjustment assembly according to the invention provides several millimeters of travel, whilst being able to be positioned with micrometer accuracy. During operation, the adjustment assembly provides a large force at first bellows 403.

When the first bellows 403, conduit 402 and second bellows 401 are made out of steel, it is ensured that the adjustment assembly is of sufficient stiffness.

Parts of the adjustment assembly that are not sufficiently stiff act as springs during use, which is undesirable for an adjustment assembly since this can lead to unwanted movement of the adjustment assembly, and a change in eigenfrequency which causes the system to resonate. Further, steel conduits and bellows are vacuum compatible which is required when the adjustment assembly is enclosed in a vacuum chamber.

The hydraulic system comprises a bleed valve 309, suited for filling or emptying the system. In an embodiment, the bleed valve 309 is advantageously be included at the lowest point in the hydraulic system to help with discharge of the liquid, and is preferably placed outside the housing of the system.

The first bellows 403 preferably comprises an internal end stop 308 to prevent full compression of the bellows when the hydraulic system is emptied. An external end stop can alternatively also be used. The end stop 308 places the support element in a service position when the hydraulic system is emptied, preventing damage to the support frame, the support element and the first bellows. The module further comprises a valve 304a for connecting to a pump 305, preferably a vacuum pump and a valve 304b for connecting to a hydraulic liquid tank 306, preferably containing water. The valves 304a and 304b are placed along conduit 302 or be jointly connected in joint 304. This arrangement allows for controlled filling of the hydraulic system, by first emptying the system through valve 309 when required, pumping the system to a certain vacuum pressure using vacuum pump 305 and filling the system with liquid from tank 306 after pumping. It was found that a vacuum pressure of less than 50 mbar and preferably less than 10 mbar is sufficient to fill the system and to ensure that no air is trapped in the bellows and conduit. Trapped air bubbles act as springs, which is undesirable in a hydraulic system. During use, the pressure in the system is approximately 6 bar. The combination of steel conduits and bellows, pressurized liquid and lack of air in the systems advantageously allows the system to accurately carry and position the components of the exposure system which may be weighing several hundreds of kilograms.

It was found that the adjustment assembly according to the present invention can also advantageously be applied in varies kinds of exposure systems, such as lithography systems, electron microscopes, wafer inspection tools or any system which requires part of the system to be placed in a known basic position and which system can experience drift over longer periods of time. This drift occurs in the systems even when no elastic or flexible elements are applied in the system. The use of the adjustment assembly according to the invention is thus not limited to lithography systems. In such systems modules or parts of the system need to be accurately positioned in a chamber, housing or enclosure with limited access.

Figure 4A:
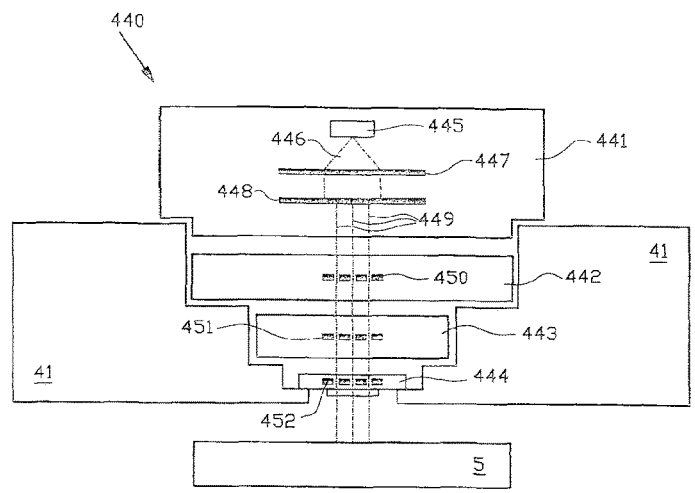
FIG. 4A schematically shows an example of an exposure apparatus for use in the substrate exposure system of FIG. 1 or 2 to provide a multi-beam charged particle beam lithography system.

FIG. 4A shows an example of an exposure apparatus for a multi-beam charged particle lithography system 440 which is arranged on the exposure apparatus frame 41. The multi-beam charged particle lithography system 440 is arranged in several modules 441, 442, 443, 444 which can be individually installed and removed from the exposure apparatus frame 41.

The upper module 441 comprises a charged particle source 445 which is arranged to generate an expanding beam 446 of charged particles, in particular electrons. The expanding charged particle beam 446 is collimated by a collimator lens 447. The collimated charged particle beam then falls onto an aperture array 448. Each aperture of said aperture array 448 which is arranged inside the collimated charged particle beam generates an individual beamlet. Accordingly, the aperture array generates multiple beamlets, in particular an array of multiple substantially parallel beamlets 449.

The array of multiple substantially parallel beamlets 449 is directed to the subsequent module 442, which comprises a deflector array 450. The deflector array 450 comprises a deflector for each one of said beamlets 449. Each deflector is arranged to deflect an individual beamlet 449 or to let said individual beamlet 449 pass without deflection. In the subsequent lower module 443 a beam stop array 451 is arranged. The beam stop array 451 is provided with an array of aperture, one aperture for each individual beamlet 449. In case an individual beamlet 449 is not deflected by the corresponding deflector of the deflector array 450, it will pass through the corresponding aperture of the aperture array 451. In case an individual beamlet 449 is deflected by the corresponding deflector of the deflector array 450, it is deflected away from the aperture of the aperture array 451 and impinges on the part of the aperture array 451 surrounding said aperture. From the view point of the substrate 5, the combination of deflection array 450 (also denoted as beam blanker array) and aperture array 451 (also denoted as beam stop array) effectively allows to switch the individual beamlets 449 on or off.

The beamlets 449 which pass the aperture array 451, are directed towards a lens array 452 in the subsequent lower module 444. The lens array 452 comprises an array of lenses for focusing the charged particle beamlets 449 onto the surface of the substrate 5. In addition this module 444 may also comprise one or more deflectors for scanning the array of beamlets 449 over the surface of the substrate 5. By suitably addressing the deflector array 450 and by scanning the beamlets 449 over the surface of the substrate 5, a pattern can be written on the surface of the substrate 5.

Figure 4B:
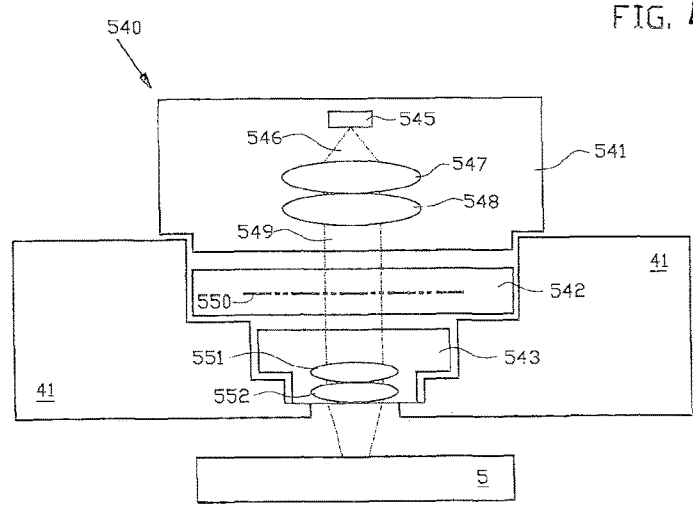
FIG. 4B schematically shows an example of an exposure apparatus for use in the substrate exposure system of FIG. 1 or 2 to provide a light-optical lithography system.

FIG. 4B shows an example of an exposure apparatus for an optical lithography system 540 which is arranged on the exposure apparatus frame 41. The optical lithography system 540 may also be arranged in several modules 541, 542, 543 which can be individually installed and removed from the exposure apparatus frame 41.

The upper module 541 comprises a light source 545 which is arranged to generate a light beam 546 which is directed to an optical system 547, 548 which is arranged to homogenize and to collimate the light beam 549. The collimated and homogenized light beam 549 is directed to the subsequent module 542 which comprises a mask 550. The mask 550 is illuminated by the light beam 549, and the transmitted light is directed to the subsequent lower module 543. It is noted that the mask 550 can be mask having a fixed pattern or a mask having switchable elements which can be switched to a transparent state or an opaque state in order to provide a changeable pattern.

In the subsequent lower module 543 a lens system 551, 552 is arranged to image the mask 550 onto the surface of the substrate 5. Accordingly the pattern of the mask 550 is projected onto the surface of the substrate 5.

Figure 4C:
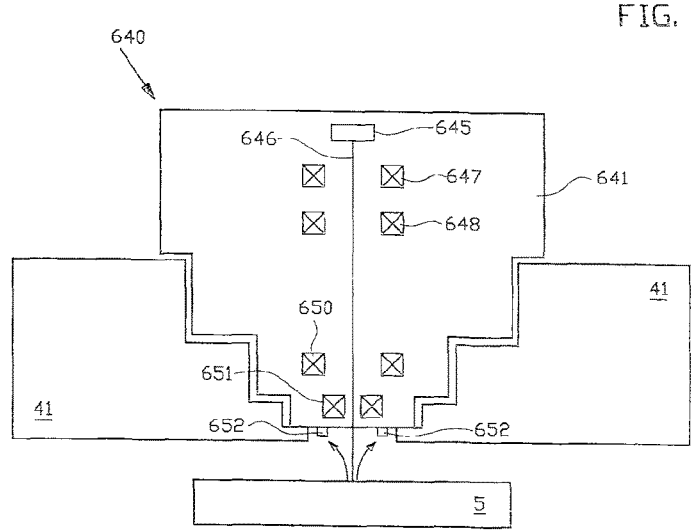
FIG. 4C schematically shows an example of an exposure apparatus for use in the substrate exposure system of FIG. 1 or 2 to provide a charged particle beam microscopy system.

FIG. 4C shows an example of an exposure apparatus for an electron microscope 640 which is arranged on the exposure apparatus frame 41. The electron microscope 640 comprises an electron source 645 which is arranged to generate an electron beam 646 which is directed to an optical system 647, 648 which is arranged to direct the electron beam 649 towards several electron lenses 650, 651 which are arranged to focus the electron beam 549 onto the surface of the substrate 5. The electron microscope 640 is usually provided with on or more deflectors for scanning the electron beam 649 over the surface of the substrate 5.

When the electron beam 649 impinges on the surface of the substrate 5, the interaction of the electrons and the material of the surface of the substrate may cause scattering of the electrons, generation of secondary electron and/or the generation of light. The electron microscope 649 is provided with sensors 652 which can detect the scattered electrons, secondary electrons and/or generated light. By scanning the electron beam 649 over the surface of the substrate 5 and detecting the scattered electrons, secondary electrons and/or generated light, the surface of the substrate 5 can be mapped and/or imaged.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

In summary, the invention relates to a substrate exposure system comprising a frame, a substrate support module for carrying a substrate, an exposure apparatus for exposing said substrate, and adjustment assembly for adjusting the position of the exposure apparatus with respect to the substrate support module. The adjustment assembly comprises a hydraulic actuator, a hydraulic generator and a conduit, wherein the conduit interconnects said hydraulic actuator and said hydraulic generator for forming a hydraulic system. The exposure apparatus, the frame, the adjustment assembly and the substrate support module are arranged as parts of a series of mechanically linked components. A first part of said series of mechanically linked components comprises the exposure apparatus, and a second part comprises the substrate support module. Said hydraulic actuator is arranged between said first part and said second part. Preferably the hydraulic actuator comprises a first bellows and the hydraulic generator comprises a second bellows. The second bellows is arranged spaced apart from the first bellows and is arranged for actuating the first bellows.

The invention claimed is:

1. Substrate exposure system comprising:
    a frame,
    a substrate support module for carrying a substrate, which substrate support module is connected to said frame,
    an exposure apparatus, wherein the exposure apparatus is carried by said frame and is arranged for exposing the substrate carried by the substrate support module, and
    an adjustment assembly for adjusting the position of the exposure apparatus with respect to the substrate support module, wherein the adjustment assembly comprises a hydraulic actuator, a hydraulic generator and a conduit, wherein the conduit interconnects said hydraulic actuator and said hydraulic generator for forming a hydraulic system, wherein the hydraulic actuator, the hydraulic generator and the conduit, at least in use, form a closed hydraulic system defining a substantially constant volume,
    wherein the exposure apparatus, the frame, the adjustment assembly and the substrate support module are arranged as parts of a series of mechanically linked components, wherein said series of mechanically linked components comprises a first part comprising at least the exposure apparatus, and a second part comprising at least the substrate support module, and wherein said hydraulic actuator is arranged between said first part and said second part of said series of the mechanically linked components.

2. Substrate exposure system according to claim 1, wherein said hydraulic actuator comprises a first bellows.

3. Substrate exposure system according to claim 1, wherein said hydraulic generator comprises a second bellows.

4. Substrate exposure system according to claim 3, wherein the second bellows is provided with a drive unit, preferably a mechanical linear drive unit, wherein the drive unit is arranged to compress or expand the second bellows for actuating the first bellows.

5. Substrate exposure system according to claim 4, wherein the drive unit comprises a motor, preferably a stepper motor.

6. System according to claim 1, wherein the system comprises at least one sensor for measuring a position of said first part with respect to said second part of said series of the mechanically linked components or a change in position of the first part of said series of mechanically linked components with respect to the second part of said series of mechanically linked components.

7. System according to claim 6, wherein the sensor is a capacitive sensor.

8. Substrate exposure system according to claim 1, wherein the exposure apparatus is moveably connected to the frame by means of at least one spring element.

9. System according to claim 8, wherein the first part of said series of mechanically linked components comprises said spring element.

10. Substrate exposure system according to claim 8, wherein the hydraulic actuator is arranged between the frame and said spring element.

11. System according to claim 10, wherein the system comprises at least one sensor, wherein the sensor is arranged for measuring a position of said first part with respect to said second part of said series of the mechanically linked components or a change in position of the exposure apparatus with respect to the second part of said series of mechanically linked components,
    preferably wherein the sensor is arranged for measuring a position of exposure apparatus with respect to a frame segment which is part of the second part of said series of mechanically linked components or a change in position of the exposure apparatus with respect to a frame segment which is part of the second part of said series of mechanically linked components.

12. System according to claim 11, wherein the sensor is arranged for measuring a vertical position of said first part with respect to said second part of said series of the mechanically linked components or a change in a vertical position of the exposure apparatus relative to the second part of said series of mechanically linked components.

13. Substrate exposure system according to claim 8, wherein the hydraulic actuator is arranged between the frame and the substrate support module.

14. System according to claim 13, wherein the system comprises at least one sensor, wherein the sensor is arranged for measuring a position of said first part with respect to said second part of said series of the mechanically linked components or a change in position of the substrate support module with respect to the first part of said series of mechanically linked components,
    preferably wherein the sensor is arranged for measuring a position of said substrate support module with respect to a frame segment which is part of the first part of said series of mechanically linked components or a change in position of the substrate support module with respect to a frame segment which is part of the first part of said series of mechanically linked components.

15. System according to claim 14, wherein the sensor is arranged for measuring a vertical position or a change in a vertical position of the substrate support module with respect to the first part of said series of mechanically linked components.

16. Substrate exposure system according to claim 1, wherein hydraulic actuator is arranged for moving the exposure apparatus with respect to the substrate support module, preferably for moving the exposure apparatus with respect to the substrate support module in a substantially vertical direction.

17. Substrate exposure system according to claim 16, wherein the hydraulic actuator comprises an end stop, preferably an internal end stop.

18. Substrate exposure system according to claim 1, further comprising a housing, wherein the exposure apparatus and the substrate support module are at least partially arranged inside said housing, wherein the hydraulic actuator is arranged inside said housing and the hydraulic generator is arranged outside said housing.

19. Substrate exposure system according to claim 18, wherein the housing comprises a wall, and wherein the conduit passes through said wall.

20. Substrate exposure system according to claim 18, wherein said housing is arranged to function as a vacuum chamber, wherein the housing is coupled to a vacuum pump for, in use, creating a vacuum or a reduced pressure inside said housing, preferably wherein the hydraulic actuator is vacuum compatible.

21. Substrate exposure system according to claim 1, wherein the frame comprises a bottom wall, side walls and an upper wall, wherein the substrate support module is arranged on said bottom wall, and wherein the exposure apparatus is connected to one or more of the side walls or to the upper wall, preferably wherein the bottom wall, side walls and upper wall of said frame are arranged to form a box or part of a box, preferably a substantially rectangular box or part of a rectangular box.

22. Substrate exposure system according to claim 21, wherein the conduit passes through one of said bottom wall, side walls and upper wall of said box.

23. Substrate exposure system according to claim 21, wherein the box is arranged inside a housing, and wherein at least one of said bottom wall, side walls and upper wall of said box is provided with an array of through openings.

24. Substrate exposure system according to claim 21, wherein at least one of said bottom wall, side walls and upper wall is provided with a shielding layer for at least partially shielding a space inside said frame from external magnetic fields, wherein said shielding layer preferably comprises a layer of a µ-metal.

25. Substrate exposure system according to claim 1, wherein the exposure apparatus is arranged inside an enclosure, wherein said enclosure is movably connected to said frame.

26. Substrate exposure system according to claim 25, wherein the exposure apparatus is moveably connected to the frame by means of at least one spring element and wherein the enclosure is connected to said spring element.

27. Substrate exposure system according to claim 25, wherein the enclosure is arranged inside a housing, and wherein said enclosure comprises at least one wall which is provided with an array of through openings.

28. Substrate exposure system according to claim 25, wherein the enclosure is arranged inside said frame, and wherein said enclosure comprises at least one wall which is provided with an array of through openings.

29. Substrate exposure system according to claim 25, wherein said enclosure is provided with a shielding layer for at least partially shielding a space inside said enclosure from external magnetic fields, wherein said shielding layer preferably comprises a layer of a µ-metal.

30. Substrate exposure system according to claim 1, comprising three adjustment assemblies, preferably wherein said three adjustment assemblies are arranged in a triangle around said exposure apparatus and/or said substrate support module.

31. Substrate exposure system according to claim 1, wherein the system is a lithography system and wherein the exposure apparatus comprises an optical column of said lithography system.

32. Substrate exposure system according to claim 31, wherein the exposure apparatus comprises a charged particle beam optical column, preferably a multi-beam charged particle optical column.

33. A method for adjusting the position of the exposure apparatus with respect to the substrate support module in a substrate exposure system according to claim 1, wherein the method comprises the step of:
  driving the hydraulic generator for actuating the hydraulic actuator which provides a change in position of the said first part with respect to said second part of said series of the mechanically linked components.

34. Method according to claim 33, wherein the method further comprising the step of:
  measuring a position of said first part with respect to said second part of said series of the mechanically linked components or measuring a change in position of the said first part with respect to said second part of said series of the mechanically linked components.

35. Method according to claim 34, wherein the method further comprising the steps of:
  generating a control signal in accordance with said measured position or change in position, and
  driving the hydraulic generator in accordance with said control signal.

36. A mechanical adjustment assembly for adjusting a position of a first part of a series of mechanically linked components with respect to a second part of a series of mechanically linked components,
  wherein said mechanical adjustment assembly comprises a first bellows, a second bellows and a conduit, wherein the conduit interconnects said first bellows and said second bellows for forming a hydraulic system, wherein the hydraulic actuator, the hydraulic generator and the conduit, at least in use, form a closed hydraulic system defining a substantially constant volume,
  wherein said first bellows is arranged between said first part and said second part of said series of the mechanically linked components, wherein the second bellows is arranged spaced apart from said first bellows, and wherein the first bellows is arranged to be actuated by said second bellows.

37. A mechanical system comprising a series of mechanically linked components and a mechanical adjustment assembly,
  wherein said mechanical adjustment assembly comprises a first bellows, a second bellows and a conduit, wherein the conduit interconnects said first bellows and said second bellows for forming a hydraulic system, wherein the hydraulic actuator, the hydraulic generator and the conduit, at least in use, form a closed hydraulic system defining a substantially constant volume, wherein said series of mechanically linked components comprises a first module and a second module, and wherein the first bellows is arranged between said first module and said second module for adjusting a position of said first module with respect to said second module, and wherein the second bellows is arranged spaced apart from said first bellows, and wherein the second bellows is arranged for actuating said first bellows.

* * * * *